(12) United States Patent
Kasuga et al.

(10) Patent No.: US 7,198,736 B2
(45) Date of Patent: Apr. 3, 2007

(54) CONDUCTIVE SILVER PASTE AND CONDUCTIVE FILM FORMED USING THE SAME

(75) Inventors: Takashi Kasuga, Osaka (JP); Kohei Shimoda, Osaka (JP); Masahiro Yamakawa, Osaka (JP)

(73) Assignee: Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 11/068,829

(22) Filed: Mar. 2, 2005

(65) Prior Publication Data

US 2005/0194577 A1 Sep. 8, 2005

(30) Foreign Application Priority Data

Mar. 3, 2004 (JP) ............................. 2004-059722

(51) Int. Cl.
*H01B 1/22* (2006.01)
*B05D 5/12* (2006.01)

(52) U.S. Cl. ........................................ 252/514; 427/96
(58) Field of Classification Search ................ 252/514; 427/96
See application file for complete search history.

(56) References Cited

U.S. PATENT DOCUMENTS 5,227,093 A * 7/1993 Cole et al. .................. 252/512

2001/0050357 A1 * 12/2001 Krohn .......................... 252/600
2005/0239947 A1 * 10/2005 Greenhill ..................... 524/495

FOREIGN PATENT DOCUMENTS

| JP | 62-145601 | 6/1987 |
|----|-----------|--------|
| JP | 01-031874 | 2/1989 |
| JP | 5-159987 | 6/1993 |
| JP | 11-066953 | 3/1999 |
| JP | 2000-053733 | 2/2000 |
| JP | 2000-239636 | 9/2000 |
| JP | 2002-161123 | 6/2002 |
| JP | 2002-299833 | 10/2002 |
| JP | 2002-299833 A | 10/2002 |
| JP | 2002-329945 | 11/2002 |
| JP | 2003-203522 | 7/2003 |

OTHER PUBLICATIONS

U.S. Appl. No. 60/548,431, filed Feb. 27, 2004.*

* cited by examiner

*Primary Examiner*—Mark Kopec
(74) *Attorney, Agent, or Firm*—McDermott Will & Emery LLP

(57) ABSTRACT

A conductive silver paste according to the present invention comprises epoxy resin, flake-shaped silver powders having an average particle diameter of 0.5 to 50 μm, and spherical silver powders, each having its surface coated with organic matter, having an average particle diameter of not more than 1 μm, and a conductive film according to the present invention is formed by printing or applying the conductive silver paste on a surface of a base material, followed by drying, and then thermosetting the epoxy resin.

5 Claims, No Drawings

CONDUCTIVE SILVER PASTE AND CONDUCTIVE FILM FORMED USING THE SAME

BACKGROUND OF THE INVENTION

The present invention relates to a conductive silver paste and a conductive film such as a conductor wiring having a fine plane shape formed using the same.

A conductive silver paste including silver powders is printed on a surface of a base material using various types of printing methods, or is applied thereon using various types of coating methods, dried, and is further heat-treated as required, thereby forming a conductive film such as a conductor wiring.

Generally used as the conductive silver paste is one containing thermosetting resin, its curing agent, silver powders, and a solvent. As the silver powders, ones having various shapes are used. Particularly in order to reduce contact resistance between the adjacent silver powders in a conductive film to improve the conductive properties of the conductive film, flake-shaped silver powders are suitably used.

However, any of the conventional silver powders are large-diameter ones having an average particle diameter of not less than 1 µm, and a filling ratio represented by a volume ratio of the silver powders in the unit volume of the conductive silver paste is low. Even if the contact resistance is reduced by changing the shape of the silver powders into a flake shape, therefore, the effect of improving the conductive properties of the conductive film has a limitation, and a further improvement in the conductive properties is required.

As various types of electronic equipment are miniaturized, it is also required that the conductor wiring composed of the conductive film is made fine. For example, in a conductor wiring having a line shape, it is required that the line width of the conductor wiring and the space width between adjacent conductor wirings are respectively not more than 100 µm. In the future, it is predicted that the conductor wiring is required to be made finer. However, the conventional large-diameter silver powders have not been able to sufficiently cope with the formation of the conductor wiring having such a fine plane shape.

When the above-mentioned conductor wiring is formed by a screen printing method using the conductive silver paste, for example, a screen having a screen opening sufficiently smaller than the line width of the conductor wiring and the space width between the conductor wirings must be used in order to satisfactorily reproduce the fine plane shape.

However, such a screen having a small opening is liable to be clogged with large-diameter silver powders having an average particle diameter of not less than 1 µm. When the screen is clogged, there occurs such inferior printing that the printed conductor wiring is scratchy and a line of the conductor wiring is broken halfway. Particularly in an edge portion of the conductor wiring, the granularity of sufficiently larger silver powders than the fine plane shape is noticeable, so that there also occurs such inferior printing that it is recognized that the edge portion of the conductor wiring is blurred.

Therefore, a silver compound paste containing minute silver oxide powders having an average particle diameter of not more than 500 nm and a tertiary fatty acid silver salt is proposed in place of the large-diameter silver powders (Japanese Patent Publication No. JP, 2003-203522, A).

When printing is done using the silver compound paste, and heat-treatment is then performed at temperatures of 150 to 250° C., silver oxide is reduced to silver, and powders of the silver obtained by the reduction is welded by deposited silver formed by the decomposition of the tertiary fatty acid silver salt, so that a continuous silver conductive film is formed.

When the tertiary fatty acid silver salt, together with the silver oxide, is kneaded to prepare the silver compound paste, it also functions as a lubricant to more finely grind the silver oxide and stably disperse powders of the ground silver oxide in the paste.

Even if the paste does not contain resin such as thermosetting resin, therefore, the silver oxide powders and fatty acid silver salt can be turned into paste. Combined with the fact that the silver oxide powders are minute, as described above, so that the filling ratio therewith can be increased, therefore, the conductive properties of the conductor wiring or the like can be more significantly improved than ever before. Further, the particle diameter of the silver oxide is small, and the silver oxide powders are further made minute in the paste by being kneaded with the tertiary fatty acid silver salt, which can sufficiently cope with the formation of a conductor wiring having a fine plane shape, as previously described.

In order to apply the paste to various types of printing methods and coating methods to form the conductive film such as the conductor wiring, however, it is preferable that resin and particularly, thermosetting resin is contained in the paste. The reason for this is that the resin has functions such as a function of preparing the viscosity of the paste in a range suitable for various types of printing methods and coating methods and a function serving as a binder of binding silver powders in the conductive film after formation to form on a surface of a base material a conductive film, which firmly adheres to the base material, superior in durability.

Therefore, it is examined that the silver oxide powders are turned into paste by being blended with the thermosetting resin, the curing agent, and the solvent. However, the silver oxide releases active oxygen to transform the thermosetting resin, thereby causing various types of abnormalities in the paste.

That is, the thermosetting resin is easily transformed and gelated by the active oxygen released from the silver oxide. If the thermosetting resin is gelated, therefore, the paste loses its uniform fluidity so that the screen is easily clogged. When the conductive film is a conductor wiring, therefore, there occurs such inferior printing that the printed conductor wiring is scratchy and a line of the conductor wiring is broken halfway.

The active oxygen prevents the curing reaction of the thermosetting resin and particularly, epoxy resin. Therefore, the function serving as a binder, described above, cannot be obtained. On the surface of the base material, the conductive film, which firmly adheres to the base material, superior in durability cannot be formed.

Japanese Patent Publication No. JP, 2002-29983, A discloses that a paste containing silver powders having an average particle diameter of 1 to 100 nm whose surfaces are processed by dispersants such as amine, alcohol, or thiol dispersants and thermosetting resin is prepared, the paste is printed or applied over a surface of a base material, followed by heating, to subject the thermosetting resin to curing reaction as well as sinter a lot of silver powders to form a conductive film. If such minute silver powders are used, it is possible to form a conductor wiring or the like having a fine plane shape which can also sufficiently cope with future requirements.

The surfaces of the silver powders are processed using the dispersant for the following reasons. That is, the minute silver powders as described above, are high in surface activity. Therefore, the silver powders are agglomerated in the paste before printing, are melted and integrated at approximately room temperature to easily produce agglomerated particles when the surfaces are not processed using the dispersant. The agglomerated particles produced by melting and integrating a large number of silver powders have a large particle diameter and have an indeterminate form. Particularly when the conductive film is a conductor wiring, therefore, the screen is clogged and correspondingly, is easily scratchy and broken. Further, an edge of the conductor wiring is also easily blurred. On the other hand, the silver powders processed using the dispersant are not agglomerated and are uniformly dispersed in the paste, so that such inferior printing may not occur.

If the minute silver powders are used, as described above, printing properties are improved, and a filling ratio is also improved. However, contact resistance between the silver powders is increased, and the effect of improving the conductive properties of the conductive film is not obtained.

SUMMARY OF THE INVENTION

An object of the present invention provides a conductive silver paste allowing a conductive film such as a conductor wiring superior in conductive properties, firmly adhering to a base material, superior in durability, and having a fine plane shape to be printed with good reproducibility and satisfactorily without causing various types of inferior printing and a conductive film formed using the same.

A conductive silver paste according to the present invention is characterized by comprising epoxy resin, flake-shaped silver powders having an average particle diameter of 0.5 to 50 μm, and spherical silver powders, each having its surface coated with organic matter, having an average particle diameter of not more than 1 μm.

The conductive silver paste according to the present invention contains the minute spherical silver powders, each having its surface coated with organic matter, having an average particle diameter of not more than 1 μm such that they are not agglomerated. Therefore, a conductive film such as a conductor wiring having a fine plane shape can be printed with good reproducibility without causing such inferior printing that it is scratchy, broken, and blurred.

The conductive properties of the conductive film can be improved more significantly than ever before by a synergistic effect produced by both improving a filling ratio with the minute spherical silver powders and reducing contact resistance by the flake-shaped silver powders having an average particle diameter of 0.5 to 50 μm.

Moreover, both the spherical silver powders and the flake-shaped silver powders may not transform the epoxy resin and prevent the curing thereof, unlike silver oxide powders. Therefore, the adhesion of the conductive film to the base material can be enhanced by the function serving as a binder of the epoxy resin to improve the durability thereof.

In the conductive silver paste, it is preferable that the average particle diameter of the spherical silver powders is not more than 100 nm. By setting the average particle diameter of the spherical silver powders to not more than 100 nm, the conductor wiring or the like having a fine plane shape can be printed with better reproducibility without causing such inferior printing that it is scratchy, broken, and blurred. Further, the conductive properties of the conductive film can be also further improved by further increasing the filling ratio.

It is preferable that the ratio of the spherical silver powders to the total amount of the flake-shaped silver powders and the spherical silver powders is not less than 1% by weight. The conductive properties of the conductive film can be further improved by containing the spherical silver powders in the conductive silver paste at the foregoing ratio to increase the filling ratio.

It is preferable that used as the epoxy resin is one in which the glass transition temperature Tg of its cured material is not less than 60° C. The heat-resistant temperature of the formed conductive film is increased by using as the epoxy resin one satisfying the foregoing conditions so that such high heat resistance as to withstand heat in the mounting of a chip, by reflow soldering, for example, can be provided to the conductor wiring or the like composed of the conductive film.

The conductive film according to the present invention is formed by printing or applying the conductive silver paste according to the present invention over the surface of the base material, followed by drying, and then thermosetting the epoxy resin and therefore, can be formed with good reproducibility without causing such inferior printing that it is scratchy, broken, and blurred even when the conductive film is a conductor wiring or the like having a fine plane shape. The conductive film becomes superior in conductive properties by a synergistic effect produced by using both the flake-shaped silver powders and the spherical silver powders. Further, the epoxy resin is satisfactorily cured without being transformed or being prevented from being cured. Therefore, the conductive film is excellent in adhesion to the base material and is superior in durability depending on the function as a binder of the epoxy resin.

In the conductive film, it is preferable that the resistivity thereof is not more than $5.0 \times 10^{-5}$ Ω·cm. The conductive properties of the conductive film can be further improved by setting the resistivity thereof to not more than $5.0 \times 10^{-5}$ Ω·cm.

DETAILED DESCRIPTION OF THE INVENTION

A conductive silver paste according to the present invention comprises epoxy resin, flake-shaped silver powders, and spherical silver powders each having its surface coated with organic matter.

Usable as the flake-shaped silver powders are silver powders having a plane shape (a flake shape) in which out of the sizes in three directions perpendicular to one another, i.e., the longitudinal direction, the transverse direction, and the thickness direction, the size in the thickness direction is approximately not more than one-second and particularly, one-fiftieth to one-fifth the maximum value of the sizes in the other two directions (the longitudinal direction and the transverse direction) and having an average particle diameter of 0.5 to 50 μm measured by a laser diffraction method. When the average particle diameter is less than 0.5 μm, the effect of reducing contact resistance caused by the flake-shaped silver powders is not obtained, and the conductive properties of the conductive film are reduced. In a case where the average particle diameter exceeds 50 μm, when the conductive silver paste is used for screen printing, for example, a screen is clogged with the flake-shaped silver powders. As a result, there occurs such inferior printing that a conductor wiring having a fine plane shape in the conductive film is scratchy and a line of the conductor wiring is broken.

It is preferable that the average particle diameter of the flake-shaped silver powders is particularly 1 to 20 μm in the above-mentioned range, considering that the screen is prevented from being clogged to prevent the inferior printing from occurring and that the contact resistance is reduced to further improve the conductive properties of the conductive film.

Usable as the flake-shaped silver powders are ones produced by various conventionally known production methods such as a liquid phase reduction method and a gas phase growth method.

Usable as the spherical silver powders are silver powders having a spherical to elliptic spherical shape, in which the ratio of a short diameter to a long diameter is $1/1$ to $1/2$, and having an average particle diameter, measured by a laser diffraction method, of not more than 1 μm. When the average particle diameter exceeds 1 μm, the effect of increasing the filling ratio with the spherical silver powders is not obtained, and the conductive properties of the conductive film are lowered.

The average particle diameter of the spherical silver powders is particularly preferably not more than 100 nm and more preferably not more than 20 nm in the above-mentioned range, considering that a conductor wiring having a fine plane shape, is printed with better reproducibility without causing such inferior printing that it is scratchy, broken, and blurred and the conductive properties thereof are further improved by increasing the filling ratio.

The lower limit of the average particle diameter of the spherical silver powders is not particularly limited. The spherical silver powders having the minimum particle diameter capable of having conductive properties as a metal can be theoretically used as the spherical silver powders. However, the average particle diameter of the spherical silver powders is in practice preferably not less than 1 nm.

Usable as the spherical silver powders are ones produced by various conventionally known production methods such as a liquid phase reduction method and a gas phase growth method. Particularly in a dispersing medium such as water, spherical silver powders produced by a so-called liquid phase reduction method for reducing silver ions to deposit the reduced silver in a spherical shape are particularly suitably used because they have spherical shapes which are uniform in particle diameter.

Examples of a method of coating surfaces of the spherical silver powders with organic matter include various methods. When the spherical silver powders are produced by the liquid phase reduction method, the spherical silver powders each having its surface coated with a dispersant which is organic matter can be obtained when the spherical silver powders are deposited in a state where an organic dispersant which is soluble in the dispersing medium is previously added to the dispersing medium.

According to the method, the spherical silver powders are produced and at the same time, the surfaces thereof are coated with organic matter. Therefore, the productivity of the spherical silver powders can be improved by omitting some producing processes. The particle diameter of the produced spherical silver powders can be made more uniform by performing deposition reaction under the presence of the dispersant.

Usable as the dispersant are any of various types of dispersants having good solubility in a dispersing medium used for a reduction deposition method. Particularly, the dispersant having a molecular weight of 1500 to 100000 is suitably used. In a case where the molecular weight of the dispersant is less than 1500, the effect of stably dispersing the spherical silver powders in the conductive silver paste may not be obtained. Even in a case where the molecular weight exceeds 100000, the effect of stably dispersing the spherical silver powders in the conductive silver paste may not be obtained. The dispersant having a high molecular weight exceeding 100000 may be interposed among the flake-shaped silver powders and the spherical silver powders in the conductive film formed using the conductive silver paste to reduce the conductive properties of the conductive film.

On the other hand, the dispersant having a high molecular weight of 1500 to 100000 easily takes a so-called loop-train-tail structure, so that it is superior in the effect of improving the dispersive properties of the spherical silver powders and may not reduce the conductive properties of the conductive film by being interposed among the flake-shaped silver powders and the spherical silver powders. The dispersant having a molecular weight of 1500 to 100000 also has the function of promoting the curing of the epoxy resin.

It is preferable that the molecular weight of the dispersant is particularly 2000 to 100000 in the above-mentioned range, considering that the spherical silver powders are dispersed more stably.

Preferable as the dispersant is an organic compound containing no S, P, B, and halogen atom, considering that a conductor wiring, an electronic component arranged in the vicinity thereof, and so on are prevented from being deteriorated.

When the dispersing medium is water and/or a water soluble organic solvent, for example, examples of a suitable dispersant satisfying the conditions include polymeric dispersant such as an amine polymeric dispersant i.e. polyethylene-imine or polyvinyl pyrrolidone; a hydrocarbon polymeric dispersant having a carboxylic acid group in a molecule i.e. polyacrylic acid or carboxymethylcellulose; poval (polyvinyl alcohol); and a copolymer having a polyethylene-imine portion and a polyethylene oxide portion in one molecule (hereinafter referred to as a "PEI-PO copolymer"). The polymeric dispersant can also function as a viscosity adjuster for the conductive silver paste. Particularly, the hydrocarbon polymeric dispersant having a carboxylic acid group in a molecule is superior in the effect of promoting the curing of the epoxy resin.

It is preferable that the coating amount of the dispersant is 0.1 to 50 parts by weight per 100 parts by weight of the spherical silver powders. In a case where the coating amount is less than 0.1 part by weight, the effect of preventing the spherical silver powders from agglomerating by being coated with the dispersant to uniformly disperse the spherical silver powders in the conductive silver paste may not be sufficiently obtained. When the coating amount exceeds 50 parts by weight, the viscosity of the conductive silver paste becomes too high. Therefore, a conductive silver paste suitable for various types of printing methods such as a screen printing method or various types of coating methods, for example, may not be obtained. The excessive dispersant may be interposed among the flake-shaped silver powders and the spherical silver powders in the conductive film formed using the conductive silver paste to reduce its conductive properties of the conductive film.

It is preferable that the ratio of the spherical silver powders (excluding organic matter with which the spherical silver powders are coated) to the total amount of the flake-shaped silver powders and the spherical silver powders is not less than 1% by weight in consideration of the effect of improving the conductive properties of the conductive film by a synergistic effect produced by using both of the silver powders. It is more preferable that the ratio of the spherical silver powders to the total amount of the flake-shaped silver powders and the spherical silver powders is particularly 5 to 30% by weight in the above-mentioned range in consideration of compatibility between the effect of improving the filling ratio with the spherical silver powders and the effect of preventing such inferior printing that the conductive film is scratchy, broken, and blurred and the effect of reducing the contact resistance by the flake-shaped silver powders.

It is preferable that the mixture ratio of the sum of the flake-shaped silver powders and the spherical silver powders (excluding the organic matter with which the silver powders are coated) to 100 parts by weight of the epoxy resin is 800 to 1000 parts by weight.

Usable as the epoxy resin is any of various types of epoxy resin such as polyphenol type epoxy resin (bisphenol A type, F type, AD type, etc.), phenol and cresol type epoxy resin (a novolac type, etc.), glycidyl ether type epoxy resin of polyol, glycidyl ester type epoxy resin of polyacid, glycidyl amine type epoxy resin of polyamine, alicyclic epoxy resin, and heterocyclic epoxy resin. Particularly, the bisphenol A-type epoxy resin and the bisphenol F-type epoxy resin are preferable.

It is preferable that used as the epoxy resin is one having a glass transition temperature Tg of not less than 60° C. after the curing thereof. In a case where the glass transition temperature is less than 60° C., a formed conductor wiring or the like may be thermally deteriorated at the time of mounting a chip by reflow soldering, for example. In order to adjust the glass transition temperature Tg after curing of the epoxy resin, epoxy resins which differ in the glass transition temperature Tg may be selected, two or more types of epoxy resins which differ in the glass transition temperature Tg may be blended, and their combination and blending ratio may be adjusted. When the conductive paste according to the present invention is employed for applications excluding the mounting of the chip by reflow soldering, the glass transition temperature Tg after curing of the epoxy resin is not limited to not less than 60° C. For example, it may be less than 60° C.

The conductive silver paste according to the present invention can contain a curing agent for curing the epoxy resin, a solvent, and other additives in addition to the foregoing components. As the curing agent, ones, suitable for the epoxy resin to be combined, out of various conventionally known types of curing agents such as an amine curing agent, a polyamino amido curing agent, an acid and acid anhydride curing agent, a basic active hydrogen compound, a tertiary amine group, an imidazole group, and others, can be suitably selected and used.

It is preferable that the conductive silver paste is cured in a temperature range of not more than 200° C., considering that the conductive film is formed on a surface of a base material composed of a general-purpose material having a low heat-resistant temperature. Therefore, it is preferable that the curing agent capable of subjecting the epoxy resin to curing reaction at a predetermined temperature of not more than 200° C. is selectively used. The curing agent in an amount corresponding to a theoretical equivalent amount of the epoxy resin, may be blended.

Usable as the solvent are various types of organic solvents allowing a uniform conductive silver paste to be obtained by dissolving epoxy resin before curing, and swelling organic matter with which the surfaces of the spherical silver powders are coated to satisfactorily disperse the spherical silver powders. However, it is preferable that the blending ratio of the solvent is adjusted, the type of the solvent is selected, and a combination is selected when two or more types of solvents are together used such that the conductive silver paste has physical properties [viscosity, surface tension, vapor pressure (boiling point), etc.] suitable for a printing method or a coating method employed for forming a conductive film. For example, it is required that the conductive silver paste used for the screen printing method has a high viscosity. Moreover, it is required that the conductive silver paste has a low vapor pressure such that it is not easily dried.

Examples of the solvent suitable for the conductive silver paste, suitable for the screen printing method, obtained by combining bisphenol A-type epoxy resin or bisphenol F-type epoxy resin with the above-mentioned polymeric dispersant include diethylene glycol monobutyl ether acetate (butyl carbitol acetate), diethylene glycol monoethyl ether acetate(carbitol acetate), methyl ethyl ketone, α-terpineol, and cellosolve acetate.

Examples of the other additive which may be blended with the conductive silver paste include Aerozil.

The conductive silver paste according to the present invention can be also used for applications for bonding a chip to a terminal formed on a base material and fixing the bonded chip, for example, in addition to suitable use as a material forming a conductive film, described below. In the case, a ground terminal and a shield terminal of the chip can be also electrically connected to a ground circuit, a shield circuit, and so on on the base material by making use of good conductive properties of the conductive silver powders. When epoxy resin having a glass transition temperature Tg of not less than 60° C. is used, as previously described, as the epoxy resin to provide heat resistance to an adhesive layer, adhesive failures can be prevented from occurring by heat when the chip is mounted on the terminal on the base material by reflow soldering.

A conductive film according to the present invention is formed by printing or applying the conductive silver paste according to the present invention on a surface of the base material, followed by drying, and then thermosetting the epoxy resin.

Examples of the printing method for printing the conductive silver paste on the surface of the base material include a screen printing method and an ink jet printing method. Examples of a coating method for applying the conductive silver paste on the surface of the base material include a doctor blade method, a spin coating method, a spray coating method, a dip coating method, and a roll coating method.

The conductive film according to the present invention can be used as conductor wirings or the like of various types of electronic equipment by being formed in a predetermined plane shape on the base material by the above-mentioned printing method and coating method.

It is preferable that the resistivity of the conductive film is not more than $5.0 \times 10^{-5}$ $\Omega \cdot cm$. A conductive film having a resistivity exceeding $5.0 \times 10^{-5}$ $\Omega \cdot cm$ is insufficient in conductive properties, and cannot be suitably employed as a conductor wiring or the like. Although the lower the resistivity of the conductive film is, the more desirable it is, the resistivity is preferably not less than $5.0 \times 10^{-6}$ $\Omega \cdot cm$ in practice. When an attempt to form a conductive film having a lower resistivity is made, the amount of the epoxy resin and the amount of organic matter with which the surfaces of the spherical silver powders are coated must be significantly reduced. Correspondingly, various problems, previously described, may arise.

EXAMPLES

Example 1

10.5 g of bisphenol A-type epoxy resin (molecular weight: 380, Tg of its cured material: 102° C.), 87.4 g of flake-shaped silver powders having an average particle diameter of 5 μm, 6.5 g of spherical silver powders having an average particle diameter of 15 nm coated with polyvinyl pyrrolidone (molecular weight: 50000) (spherical silver powders: 5.3 g, polyvinyl pyrrolidone: 1.2 g), an imidazole curing agent in an amount corresponding to a theoretical equivalent amount of epoxy resin, and butyl carbitol acetate serving as a solvent were mixed, followed by agitation using a three-roll mill, to produce a conductive silver paste.

TABLE 1

| Component | Content (g) |
|---|---|
| Epoxy resin | 10.5 |
| Flake-shaped silver powders | 87.4 |
| Spherical silver powder | 5.3 |
| Polyvinyl pyrrolidone | 1.2 |

The conductive silver paste was applied over a base material using a doctor blade method, and was then heat-treated at 200° C. for thirty minutes in a constant temperature bath after the solvent was dried, to form a conductive film. The resistivity of the conductive film was measured using a resistivity meter [LORESTA™ manufactured by Mitsubishi Chemical Corporation], to estimate the conductive properties thereof. As the basis of the estimate, a resistivity of $5.0 \times 10^{-5}$ Ω·cm was taken as a reference value, to estimate the conductive properties to be good when the resistivity is not more than the reference value, while estimating the conductive properties to be poor when the resistivity exceeds the reference value. As a result, the resistivity of the conductive film formed using the conductive silver paste in the example 1 was $1.5 \times 10^{-5}$ Ω·cm, and it was confirmed that the conductive film had good conductive properties.

A plurality of parallel line-shaped conductor wirings having a line width of 100 μm, a space width of 100 μm, and a length of 100 mm were printed by a screen printing method using the conductive silver paste, to observe whether or not a line of the conductor wiring was broken, and the conductor wiring was scratchy and blurred, for example. When the conductor wiring in which any inferior printing was confirmed was estimated to have poor printing properties, and the conductor wiring in which no inferior printing was confirmed was estimated to have good printing properties, no inferior printing was found in the conductor wiring formed using the conductive silver paste in the example 1, and it was confirmed that printing properties were good.

Example 2

A conductive silver paste was produced in the same manner as that in the example 1 except that the amount of flake-shaped silver powders having an average particle diameter of 5 μm was 82.3 g, and the amount of spherical silver powders having an average particle diameter of 15 nm coated with polyvinyl pyrrolidone (molecular weight: 50000) was 14.5 g (spherical silver powders: 12.1 g, polyvinyl pyrrolidone: 2.4 g).

TABLE 2

| Component | Content (g) |
|---|---|
| Epoxy resin | 10.5 |
| Flake-shaped silver powders | 82.3 |
| Spherical silver powders | 12.1 |
| Polyvinyl pyrrolidone | 2.4 |

When a conductive film was formed in the same manner as that in the example 1 using the conductive silver paste of example 2, to measure the resistivity thereof, the resistivity was $9.5 \times 10^{-6}$ Ω·cm, and it was confirmed that the conductive film had good conductive properties. When a conductor wiring was formed and observed in the same manner as that in the example 1 using the conductive silver paste of example 2, no inferior printing was found, and it was confirmed that printing properties were good.

Example 3

A conductive silver paste was produced in the same manner as that in the example 1 except that the amount of flake-shaped silver powders having an average particle diameter of 5 μm was 71.8 g, and 20.2 g of spherical silver powders having an average particle diameter of 15 nm coated with polyethylene-imine (molecular weight: 60000) (spherical silver powders: 19.8 g, polyethylene-imine: 0.4 g) were used.

TABLE 3

| Component | Content (g) |
|---|---|
| Epoxy resin | 10.5 |
| Flake-shaped silver powders | 71.8 |
| Spherical silver powders | 19.8 |
| Polyethylene-imine | 0.4 |

When a conductive film was formed in the same manner as that in the example 1 using the conductive silver paste of example 3, to measure the resistivity thereof, the resistivity was $8.0 \times 10^{-6}$ Ω·cm, and it was confirmed that the conductive film had good conductive properties. When a conductor wiring was formed and observed in the same manner as that in the example 1 using the conductive silver paste of example 3, no inferior printing was found, and it was confirmed that printing properties were good.

Example 4

A conductive silver paste was produced in the same manner as that in the example 1 except that the amount of flake-shaped silver powders having an average particle diameter of 5 μm was 62.7 g, and 23.0 g of spherical silver powders having an average particle diameter of 15 nm coated with polyethylene-imine (molecular weight: 45000) (spherical silver powders: 21.4 g, polyethylene-imine: 1.6 g) were used.

TABLE 4

| Component | Content (g) |
| --- | --- |
| Epoxy resin | 10.5 |
| Flake-shaped silver powders | 62.7 |
| Spherical silver powders | 21.4 |
| Polyethylene-imine | 1.6 |

When a conductive film was formed in the same manner as that in the example 1 using the conductive silver paste of example 4, to measure the resistivity thereof, the resistivity was $6.5 \times 10^{-6}$ Ω·cm, and it was confirmed that the conductive film had good conductive properties. When a conductor wiring was formed and observed in the same manner as that in the example 1 using the conductive silver paste of example 4, no inferior printing was found, and it was confirmed that printing properties were good.

Example 5

10.5 g of bisphenol F-type epoxy resin (molecular weight: 500, Tg of its cured material: 78° C.), 75.4 g of flake-shaped silver powders having an average particle diameter of 15 μm, 17.9 g of spherical silver powders having an average particle diameter of 15 nm coated with polyvinyl pyrrolidone (molecular weight: 35000) (spherical silver powders: 15.9 g, polyvinyl pyrrolidone 2.0 g), an amine curing agent in an amount corresponding to a theoretical equivalent amount of epoxy resin, and methyl ethyl ketone serving as a solvent were mixed, followed by agitation using a three-roll mill, to produce a conductive silver paste.

TABLE 5

| Component | Content (g) |
| --- | --- |
| Epoxy resin | 10.5 |
| Flake-shaped silver powders | 75.4 |
| Spherical silver powders | 15.9 |
| Polyvinyl pyrrolidone | 2.0 |

The conductive silver paste was applied over a base material using a doctor blade method, and was heat-treated at 200° C. for sixty minutes in a constant temperature bath after the solvent was dried, to form a conductive film. When the resistivity of the conductive film was measured in the same manner as that in the example 1, the resistivity was $2.5 \times 10^{-5}$ Ω·cm, so that it was confirmed that the conductive film had good conductive properties. When a conductor wiring was formed and observed in the same manner as that in the example 1 using the conductive silver paste of example 5, no inferior printing was found, and it was confirmed that printing properties were good.

Example 6

A conductive silver paste was produced in the same manner as that in the example 5 except that the amount of flake-shaped silver powders having an average particle diameter of 15 μm was 73.5 g, and 19.4 g of spherical silver powders having an average particle diameter of 15 nm coated with carboxy methyl cellulose (molecular weight: 5000) (spherical silver powders: 19.2 g, carboxy methyl cellulose: 0.2 g) were used.

TABLE 6

| Component | Content (g) |
| --- | --- |
| Epoxy resin | 10.5 |
| Flake-shaped silver powders | 73.5 |
| Spherical silver powders | 19.2 |
| Carboxy methyl cellulose | 0.2 |

When a conductive film was formed in the same manner as that in the example 5 using the conductive silver paste of example 6, to measure the resistivity thereof, the resistivity was $1.9 \times 10^{-5}$ Ω·cm, and it was confirmed that the conductive film had good conductive properties. When a conductor wiring was formed and observed in the same manner as that in the example 1 using the conductive silver paste of example 6, no inferior printing was found, and it was confirmed that printing properties were good.

Comparative Example 1

A conductive silver paste was produced in the same manner as that in the example 1 except that 89.7 g of flake-shaped silver powders having an average particle diameter of 100 μm, and 7.4 g of spherical silver powders having an average particle diameter of 15 nm coated with polyethylene-imine (molecular weight: 50000) (spherical silver powders: 5.7 g, polyethylene-imine: 1.7 g) were used.

TABLE 7

| Component | Content (g) |
| --- | --- |
| Epoxy resin | 10.5 |
| Flake-shaped silver powders | 89.7 |
| Spherical silver powders | 5.7 |
| Polyethylene-imine | 1.7 |

When a conductive film was formed in the same manner as that in the example 1 using the conductive silver paste of comparative example 1, to measure the resistivity thereof, the resistivity was $3.0 \times 10^{-5}$ Ω·cm, and it was confirmed that the conductive film had good conductive properties. When a conductor wiring was formed and observed in the same manner as that in the example 1 using the conductive silver paste of comparative example 1, it was confirmed that a line of the conductor wiring was broken, and the conductor wiring was scratchy and blurred, and it was confirmed that printing properties were poor.

Comparative Example 2

10.5 g of bisphenol A-type epoxy resin (molecular weight: 500, Tg of its cured material 97° C.), 84.1 g of flake-shaped silver powders having an average particle diameter of 0.2 μm, 8.1 g of spherical silver powders having an average particle diameter of 15 nm coated with polyvinyl pyrrolidone (molecular weight: 35000) (spherical silver powders: 6.9 g, polyvinyl pyrrolidone 1.2 g), an amine curing agent in an amount corresponding to a theoretical equivalent amount of epoxy resin, and carbitol acetate serving as a solvent were mixed, followed by agitation using a three-roll mill, to produce a conductive silver paste.

TABLE 8

| Component | Content (g) |
|---|---|
| Epoxy resin | 10.5 |
| Flake-shaped silver powders | 84.1 |
| Spherical silver powders | 6.9 |
| Polyvinyl pyrrolidone | 1.2 |

When a conductive film was formed in the same manner as that in the example 1 using the conductive silver paste of comparative example 2, to measure the resistivity thereof, the resistivity was $6.2 \times 10^{-5}$ $\Omega \cdot cm$, and it was confirmed that the conductive film had poor conductive properties. When a conductor wiring was formed and observed in the same manner as that in the example 1 using the conductive silver paste of comparative example 2, no inferior printing was found, and was confirmed that printing properties were good.

Comparative Example 3

A conductive silver paste was produced in the same manner as that in the example 1 except that 89.7 g of flake-shaped silver powders having an average particle diameter of 15 μm, and 6.0 g of spherical silver powders having an average particle diameter of 1.5 μm coated with carboxy methyl cellulose (molecular weight: 5000) (spherical silver powders: 5.7 g, carboxy methyl cellulose: 0.3 g) were used.

TABLE 9

| Component | Content (g) |
|---|---|
| Epoxy resin | 10.5 |
| Flake-shaped silver powders | 89.7 |
| Spherical silver powders | 5.7 |
| Carboxy methyl cellulose | 0.3 |

When a conductive film was formed in the same manner as that in the example 5 using the conductive silver paste of comparative example 3, to measure the resistivity thereof, the resistivity was $8.0 \times 10^{-5}$ $\Omega \cdot cm$, and it was confirmed that the conductive film had poor conductive properties. When a conductor wiring was formed and observed in the same manner as that in the example 1 using the conductive silver paste of comparative example 3, no inferior printing was found, and it was confirmed that printing properties were good.

Comparative Example 4

A conductive silver paste was produced in the same manner as that in the comparative example 2 except that 84.9 g of flake-shaped silver powders having an average particle diameter of 10 μm, and 6.5 g of spherical silver powders having an average particle diameter of 3 μm coated with polyvinyl pyrrolidone (molecular weight: 50000) (spherical silver powders: 6.1 g, polyvinyl pyrrolidone: 0.4 g) were used.

TABLE 10

| Component | Content (g) |
|---|---|
| Epoxy resin | 10.5 |
| Flake-shaped silver powders | 84.9 |
| Spherical silver powders | 6.1 |
| Polyvinyl pyrrolidone | 0.4 |

When a conductive film was formed in the same manner as that in the example 5 using the conductive silver paste of comparative example 4, to measure the resistivity thereof, the resistivity was $7.2 \times 10^{-5}$ $\Omega \cdot cm$, and it was confirmed that the conductive film had poor conductive properties. When a conductor wiring was formed and observed in the same manner as that in the example 1 using the conductive silver paste of comparative example 4, no inferior printing was found, and it was confirmed that printing properties were good.

Comparative Example 5

A conductive silver paste was produced in the same manner as that in the example 1 except that only 95.4 g of flake-shaped silver powders having an average particle diameter of 15 μm were used, no spherical silver powders were blended, and α-terpineol was used as a solvent.

TABLE 11

| Component | Content (g) |
|---|---|
| Epoxy resin | 10.5 |
| Flake-shaped silver powders | 95.4 |

When a conductive film was formed in the same manner as that in the example 1 using the conductive silver paste of comparative example 5, to measure the resistivity thereof, the resistivity was $6.7 \times 10^{-5}$ $\Omega \cdot cm$, and it was confirmed that the conductive film had poor conductive properties. When a conductor wiring was formed and observed in the same manner as that in the example 1 using the conductive silver paste of comparative example 5, it was confirmed that a line of the conductor wiring was broken, and the conductor wiring was scratchy and blurred, and it was confirmed that printing properties were poor.

Comparative Example 6

A conductive silver paste was produced in the same manner as that in the example 1 except that only 118.3 g of spherical silver powders having an average particle diameter of 15 nm coated with polyethylene-imine (a molecular weight: 30000) (spherical silver powders: 91.0 g, polyethylene-imine: 27.3 g) were used, and no flake-shaped silver powders were blended.

TABLE 12

| Component | Content (g) |
|---|---|
| Epoxy resin | 10.5 |
| Spherical silver powders | 91.0 |
| Polyethylene-imine | 27.3 |

When a conductive film was formed in the same manner as that in the example 1 using the conductive silver paste of comparative example 6, to measure the resistivity thereof, the resistivity was $5.6 \times 10^{-5}$ Ω·cm, and it was confirmed that the conductive film had poor conductive properties. When a conductor wiring was formed and observed in the same manner as that in the example 1 using the conductive silver paste of comparative example 6, no inferior printing was found, and it was confirmed that printing properties were good.

Examination of glass transition temperature of epoxy resin:

Six types of epoxy resin (see Table 14) which differ in glass transition temperature Tg after curing were prepared. 7.0 g of any one type of epoxy resin, 115.6 g of flake-shaped silver powders having an average particle diameter of 3.5 µm, 3.6 g of spherical silver powders having an average particle diameter of 5 nm coated with polyvinyl pyrrolidone (molecular weight: 35000) (spherical silver powders: 2.4 g, polyvinyl pyrrolidone: 1.2 g), an imidazole curing agent in an amount corresponding to a theoretical equivalent amount of the epoxy resin, and α-terpineol serving as a solvent were mixed, followed by agitation using a three-roll mill, to produce a conductive silver paste.

TABLE 13

| Component | Content (g) |
|---|---|
| Epoxy resin | 7.0 |
| Flake-shaped silver powders | 115.6 |
| Spherical silver powders | 2.4 |
| Polyvinyl pyrrolidone | 1.2 |

When a chip capacitor was bonded to a copper terminal of a substrate using the above-mentioned conductive silver paste, and was mounted by reflow soldering at a temperature of 260° C., and the rate of occurrence of adhesive failures (% by number) was then estimated, it was found that the rate of occurrence of adhesive failures was not less than 35% when the glass transition temperature Tg after curing of the epoxy resin was less than 60° C., while being able to be 0% if the glass transition temperature Tg after curing of the epoxy resin was not less than 60° C., as shown in Table 14.

TABLE 14

| Glass transition temperature Tg of epoxy resin | Rate of occurrence of adhesive failures |
|---|---|
| 35° C. | 65% |
| 50° C. | 40% |
| 55° C. | 35% |
| 60° C. | 0% |
| 78° C. | 0% |
| 102° C. | 0% |

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A conductive silver paste, characterized by comprising:
   epoxy resin;
   flake-shaped silver powders having an average particle diameter of 0.5 to 50 µm; and
   spherical silver powders produced in a dispersing medium by reducing silver ions to deposit in a spherical shape under the presence of an organic dispersant soluble in the dispersing medium, each having its surface coated with the organic dispersant, having an average particle diameter of not more than 20 nm.

2. The conductive silver paste according to claim 1, characterized in that the ratio of the spherical silver powders to the total amount of the flake-shaped silver powders and the spherical silver powders is not less than 1% by weight.

3. The conductive silver paste according to claim 1, characterized in that the glass transition temperature Tg of a cured material of the epoxy resin is not less than 60° C.

4. A conductive film characterized by being formed by printing or applying the conductive silver paste according to any one of claims 1, 2, or 3 on a surface of a base material, followed by drying, and then thermosetting the epoxy resin.

5. The conductive film according to claim 4, characterized in that the resistivity thereof is not more than $5.0 \times 10^{-5}$ Ω·cm.

\* \* \* \* \*